US010790411B2

(12) United States Patent
Manders et al.

(10) Patent No.: US 10,790,411 B2
(45) Date of Patent: Sep. 29, 2020

(54) QUANTUM DOT LED WITH SPACER PARTICLES

(71) Applicant: Nanosys, Inc., Milpitas, CA (US)

(72) Inventors: Jesse Manders, Mountain View, CA (US); Christian Ippen, Sunnyvale, CA (US); Donald Zehnder, San Carlos, CA (US); Jonathan Truskier, Oakland, CA (US); Charles Hotz, San Rafael, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 15/824,701

(22) Filed: Nov. 28, 2017

(65) Prior Publication Data
US 2018/0158984 A1 Jun. 7, 2018

Related U.S. Application Data

(60) Provisional application No. 62/428,888, filed on Dec. 1, 2016.

(51) Int. Cl.
*H01L 33/06* (2010.01)
*H01L 51/50* (2006.01)
*H01L 33/00* (2010.01)
*H01L 33/14* (2010.01)
*H01L 33/08* (2010.01)
*H01L 33/42* (2010.01)

(52) U.S. Cl.
CPC .......... *H01L 33/06* (2013.01); *H01L 33/0029* (2013.01); *H01L 33/0083* (2013.01); *H01L 33/14* (2013.01); *H01L 51/502* (2013.01); *H01L 33/08* (2013.01); *H01L 33/42* (2013.01)

(58) Field of Classification Search
CPC .... H01L 33/0029; H01L 33/06; H01L 51/502
See application file for complete search history.

(56) References Cited

U.S. PATENT DOCUMENTS

| 6,878,870 | B2* | 4/2005 | Aldridge | A63B 69/004 324/658 |
|---|---|---|---|---|
| 9,139,770 | B2 | 9/2015 | Freeman et al. | |
| 9,169,435 | B2 | 10/2015 | Guo et al. | |
| 9,199,842 | B2 | 12/2015 | Dubrow et al. | |
| 2007/0057263 | A1 | 3/2007 | Kahen | |
| 2008/0001538 | A1 | 1/2008 | Cok | |

(Continued)

OTHER PUBLICATIONS

Lim et al (Chem. Mater. 2011, 23, 20, 4459-4463) (Year: 2011).*

(Continued)

*Primary Examiner* — Samuel A Gebremariam
*Assistant Examiner* — Jonas T Beardsley
(74) *Attorney, Agent, or Firm* — Sterne, Kessler, Goldstein & Fox P.L.L.C.

(57) ABSTRACT

Embodiments of the present application relate to the use of quantum dots mixed with spacer particles. An illumination device includes a first conductive layer, a second conductive layer, and an active layer disposed between the first conductive layer and the second conductive layer. The active layer includes a plurality of quantum dots that emit light when an electric field is generated between the first and second conductive layers. The quantum dots are interspersed with spacer particles that do not emit light when the electric field is generated between the first and second conductive layers.

21 Claims, 4 Drawing Sheets

(56) References Cited

U.S. PATENT DOCUMENTS

| | | | | |
|---|---|---|---|---|
| 2008/0217602 A1* | 9/2008 | Kahen | ................... | H01L 33/18 |
| | | | | 257/13 |
| 2011/0284819 A1* | 11/2011 | Kang | ................... | B82Y 20/00 |
| | | | | 257/9 |
| 2015/0194467 A1* | 7/2015 | Zhang | ................. | H01L 27/156 |
| | | | | 257/13 |
| 2016/0218252 A1 | 7/2016 | Steckel et al. | | |

OTHER PUBLICATIONS

Moroz et al., "Suppressed Carrier Scattering in CdS-Encapsulated PbS Nanocrystal Films," ACS Nano, vol. 7, No. 8 (2013); pp. 6964-6977.

International Search Report and Written Opinion, dated Feb. 16, 2018, for PCT Appl. No. PCT/US2017/063897, 12 pages.

* cited by examiner

QUANTUM DOT LED WITH SPACER PARTICLES

CROSS-REFERENCE TO RELATED APPLICATIONS

This application claims the benefit of U.S. Provisional Application No. 62/428,888, filed Dec. 1, 2016, the disclosure of which is incorporated by reference herein in its entirety.

FIELD

The present application relates to quantum dot emission technology, and to illumination devices that include a mixture of quantum dots and spacer particles.

BACKGROUND

Semiconductor nanocrystallites (quantum dots) whose radii are smaller than the bulk exciton Bohr radius constitute a class of materials intermediate between molecular and bulk forms of matter. Quantum confinement of both the electron and hole in all three dimensions leads to an increase in the effective band gap of the material with decreasing crystallite size. Consequently, both the optical absorption and emission of quantum dots shift to the blue (higher energies) as the size of the dots gets smaller. Quantum dots can absorb light having a first wavelength and emit light having a longer wavelength than that absorbed. Incorporating quantum dots in display devices, such as LCDs, has been shown to produce highly vibrant colors while reducing the overall power consumption. Quantum dots provide desirable characteristics due to their low power consumption, low manufacturing cost, and highly vibrant light output.

A quantum dot LED (QLED) generally consists of a multilayer structure wherein successive layers are deposited on top of each other in sequential order. A general QLED structure includes an active layer consisting of quantum dots (QDs). It has been shown that when QDs are in close proximity to each other, non-radiative quenching pathways such as Förster resonance energy transfer, are active. This effectively reduces the QDs' light-emitting efficiency.

SUMMARY

Embodiments of the present application relate to a technique for mitigating the non-radiative quenching that occurs when QDs are in close proximity to one another.

According to an embodiment, an illumination device includes a first conductive layer, a second conductive layer, and an active layer disposed between the first conductive layer and the second conductive layer. The active layer includes a plurality of quantum dots that emit light when an electric field is generated between the first and second conductive layers. The quantum dots are interspersed with spacer particles that do not emit light when the electric field is generated between the first and second conductive layers.

According to another embodiment, a method of making an illumination device includes depositing a first conductive layer on a substrate. The method also includes mixing a plurality of quantum dots with a plurality of spacer particles to form an active mixture and depositing the active mixture as an active layer located above the first conductive layer. The active layer includes the quantum dots interspersed with the spacer particles. The method also includes depositing a second conductive layer above the active layer. The quantum dots in the active layer emit light when an electric field is generated between the first and second conductive layers while the spacer particles do not emit light when the electric field is generated between the first and second conductive layers.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments and, together with the description, further serve to explain the principles of the present embodiments and to enable a person skilled in the relevant art(s) to make and use the present embodiments.

Figure 1:
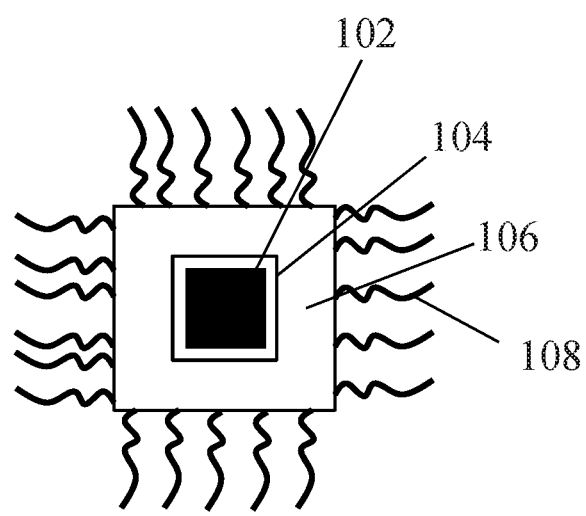
FIG. 1 illustrates the structure of a quantum dot (QD), according to an embodiment.

The features and advantages of the present embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It should be understood that the words "above" and "below" are used herein to identify relative position of one layer to another, and that there may be intervening layers between the two. For example, if a first layer is said to be above a second layer, then the first layer may be directly on the second layer, or there may be other layers between the first layer and second layer. Conversely, it should be understood that the word "on" is used herein to identify that a layer is directly contacting another layer. For example, if a first layer is said to be on a second layer, then the first layer is in direct contact with the second layer. It should also be understood that the word "between" is used herein to identify a position of a layer relative to two other layers, even though there can be intervening layers. For example, if a first layer is said to be between a second layer and a third layer, then the first layer may contact both the second and third layers, or there may be intervening layers between the first layer and the second layer and between the first layer and the third layer.

Before describing the details of the embodiments herein, a brief description of quantum dots (QDs) will be discussed. Quantum dots may be used in a variety of applications that benefit from having sharp, stable, and controllable emissions in the visible and infrared spectrum. FIG. 1 illustrates an example of the core-shell structure of a quantum dot 100, according to an embodiment. Quantum dot 100 includes a core material 102, an optional buffer layer 104, a shell material 106, and a plurality of ligands 108.

Core material 102 includes a semiconducting material that emits light upon absorption of higher energies. Examples of core material 102 include indium phosphide (InP), cadmium selenide (CdSe), zinc sulfide (ZnS), zinc selenide (ZnSe), lead sulfide (PbS), indium arsenide (InAs), indium gallium phosphide, (InGaP), and cadmium telluride (CdTe). Any other III-V, tertiary, or quaternary semiconductor structures that exhibit a direct band gap may be used as well. Of these materials, InP and CdSe are most often used, but InP is more desirable to implement over CdSe due to the toxicity of CdSe dust. Additionally, ZnSe has been used to form blue-emitting QDs. ZnSe may exhibit emissions having a full-width-half-max (FWHM) of between about 10 nm and about 20 nm. CdSe may exhibit emissions having a FWHM range of around 30 nm, while InP may exhibit emissions having a FWHM range of around 40 nm.

Buffer layer 104 may surround core material 102. Buffer layer 104 may be zinc selenide sulfide (ZnSeS) and is typically very thin (e.g., on the order of 1 monolayer). Buffer layer 104 may have a wider band gap than core material 102, thus confining excitation to the core of quantum dot 100. Buffer layer 104 may have a lattice constant between that of core material 102 and shell material 106 to result in a smooth interface between core material 102 and shell material 106, therefore increasing the quantum efficiency.

Shell material 106 may be on the order of two monolayers thick and is typically, though not required, also a semiconducting material. The shells provide protection to core material 102. A commonly used shell material is zinc sulfide (ZnS), although other materials may be used as well. Shell material 106 may be formed via a colloidal process similar to that used to form core material 102.

In another embodiment, quantum dot 100 does not have distinct core and shell regions, but rather a material gradient from the center of quantum dot 100 moving outwards to the edge of quantum dot 100.

Ligands 108 may be adsorbed or bound to an outer surface of shell material 106. Ligands 108 may be included to help separate (e.g., disperse) the quantum dots from one another. If the quantum dots are allowed to aggregate as they are being formed, the quantum efficiency drops and quenching of the optical emission occurs. Ligands 108 may also be used to impart certain properties to quantum dot 102, such as hydrophobicity, or to provide reaction sites for other compounds to bind. A wide variety of ligands 108 exist that may be used with quantum dot 102. In an embodiment, ligands 108 from the aliphatic amine or aliphatic acid families are used. Further details on the fabrication of the quantum dots may be found in U.S. Pat. Nos. 9,169,435, 9,199,842, and 9,139,770, the discloses of which are each incorporated herein by reference.

The use of ligands 108 on the QDs may not be enough to satisfactorily reduce quenching. QDs may still aggregate too closely resulting in the activation of non-radiative quenching pathways such as Förster resonance energy transfer. According to an embodiment, QDs are further spaced from one another by mixing with non-luminescent spacer particles.

Figure 2:
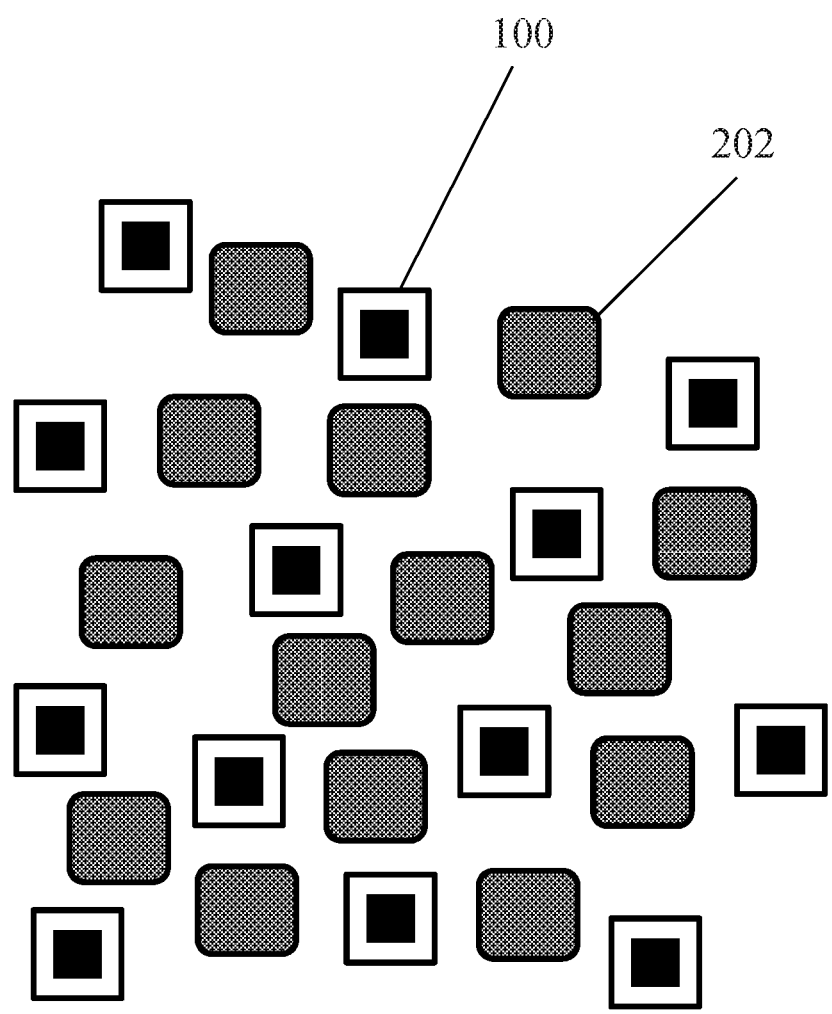
FIG. 2 illustrates a view of QDs interspersed with spacer particles, according to an embodiment.

FIG. 2 illustrates an example mixture of QDs 100 with spacer particles 202 in a solvent solution, according to an embodiment. Spacer particles 202 may be synthesized separately from QDs 100 and then mixed with QDs any time during or after the synthesis of QDs and before the solution is deposited to form an active layer of the QDs in a device. The solvent solution may include any non-polar solvent such as toluene, hexane, heptane, octane, nonane, decane, cyclohexane, p-/o-/m-xylene, mesitylene, chloroform, chlorobenzene, or p-/o-/m-dichlorobenzene to name a few examples. Polar solvents may be possible to use as well if ligands 108 are non-aliphatic and/or exhibit a hydrophilic moiety interacting with the polar solvent.

Spacer particles 202 may comprise any inorganic particles, according to an embodiment. Ideally, spacer particles 202 should not emit any light during activation of QDs 100. In one example, spacer particles 202 should have a bandgap that is at least wider than that of QDs 100. In another example, spacer particles 202 should not be too insulative such that they act as a charge injection barrier between QDs 100 and the neighboring hole or electron transport layers in a device. According to an embodiment, spacer particles 202 comprise a semiconducting material. In one example, spacer particles 202 are the same material as the shell structure of QDs 100. If QDs 100 have a blue-emitting ZnSe core with a ZnS shell, then spacer particles 202 may also be ZnS, for example. Spacer particles 202 may all be the same material, or may be various materials.

Spacer particles 202 may include ligands (not shown) bound to an outer surface of spacer particles 202 to prevent aggregate clumping of the particles, according to an embodiment. In one example, the ligands on spacer particles 202 are the same as ligands 108 on QDs 100.

Spacer particles 202 may vary in size, shape, and concentration. Spacer particles 202 may be about the same size, on average, as QDs 100. Differently sized spacer particles 202 may be mixed with QDs 100 to affect the spacing and charge transport ability of the QDs 100. For example, QDs 100 may be mixed with a first concentration of spacer particles that have about the same size as QDs 100, and with a second concentration of spacer particles that have smaller size than QDs 100. In an embodiment, spacer particles 202 may be mixed with QDs 100 in a 2:1 concentration ratio by weight. In another embodiment, spacer particles 202 may be mixed with QDs 100 in a 1:1 concentration ratio by weight. In yet another embodiment, spacer particles 202 may be mixed with QDs 100 in a 1:2 concentration ratio by weight.

Table 1 below provides quantum yield and absorbance data for various mixtures of QDs and spacer particles deposited over a layer of polyvinyl carbazole (PVK). The QDs were blue-emitting ZnSe/ZnS, while the spacer particles were ZnS particles having an average size of 9 nm with an absorption onset of 355 nm. Such spacer particles were found to be suitable for mixing with the QDs due to their similar particle size, wider band gap, and identical surface ligands to help ensure miscibility.

TABLE 1

| Film Sample | Quantum Yield | Absorbance (OD) |
| --- | --- | --- |
| PVK/QD only | 21.5% | 0.040 |
| PVK/(ZnS + QD 2:1) | 65.6% | 0.013 |
| PVK/(ZnS + QD 1:1) | 76.6% | 0.022 |
| PVK/(ZnS + QD 1:2) | 53.8% | 0.016 |

As can be seen from the data in Table 1, the quantum yield of the film sample substantially increases when using the ZnS spacer particles versus no spacer particles. The quantum yield was at its highest when the concentration by weight of the spacer particles to the QDs was even. The quantum yield decreased when the concentration by weight of QDs was larger than the concentration of spacer particles, likely due to the quenching that occurs when the QDs are too close to one another. Similarly, the sample that includes only QDs exhibited the lowest quantum yield. The absorbance data indicates that the total concentration of QDs was much lower in the samples that included a mixture with spacer particles versus the sample with only QDs, yet the quantum yield was higher in these samples with the lower QD concentration.

Figure 3:
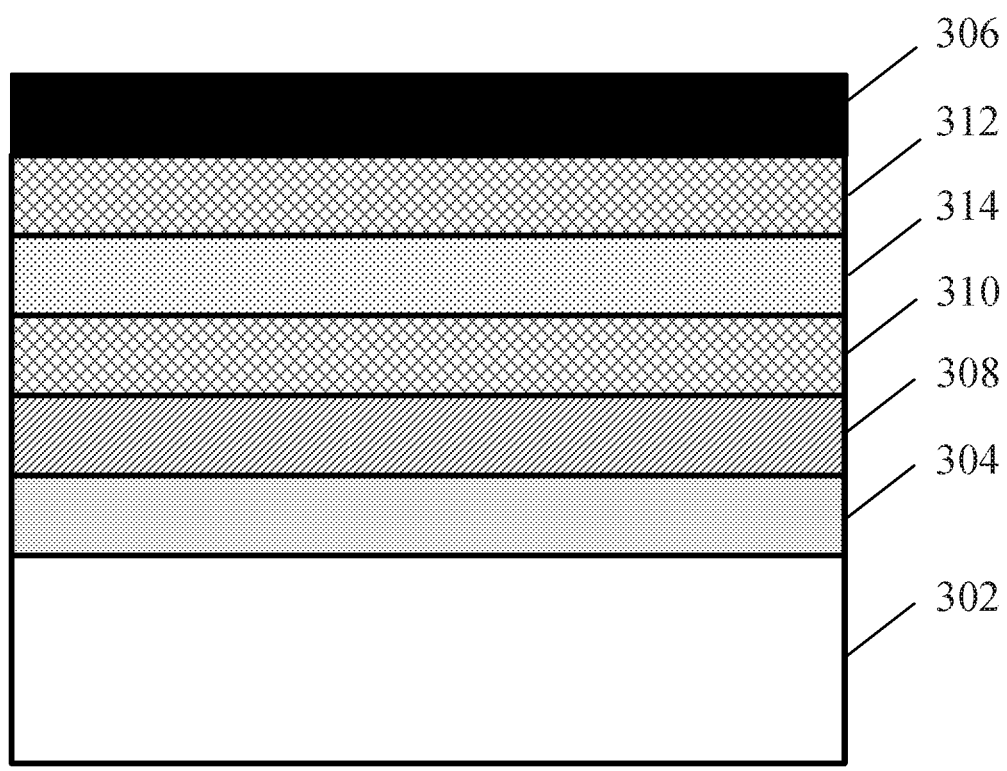
FIG. 3 illustrates a layer structure of an illumination device, according to an embodiment.

FIG. 3 illustrates an example layer structure that may be used in an illumination device, according to an embodiment. The illumination device may be a quantum dot light emitting diode (QLED). The illumination device may be used in a wide variety of applications, such as flexible electronics, touchscreens, monitors, televisions, cellphones, and any other high definition displays. Other layers may be included in the layer structure beyond those specifically illustrated in FIG. 3.

The layer structure of the illumination device includes a substrate 302. Substrate 302 may be a transparent substrate, such as glass. Substrate 302 may be a flexible material such as polyimide, or a flexible and transparent material such as polyethylene terephthalate. Substrate 302 may have a thickness of about 0.1 mm to 2 mm. Disposed on the glass substrate 302 is a first conductive layer 304. According to an embodiment, first conductive layer 304 comprises indium tin oxide (ITO), which is a substantially transparent conductive material. First conductive layer 304 may represent a stack of conductive layers. For example, first conductive layer 304 may include a layer of ITO and a layer of aluminum. First conductive layer 304 may have a thickness between about 50 nm and about 250 nm. First conductive layer 304 may be deposited as a thin film using any known deposition technique, such as, for example, sputtering or electron-beam evaporation.

The total layer structure may be sandwiched between first conductive layer 304 and a second conductive layer 306, according to an embodiment. First conductive layer 304 may act as the anode of the device while second conductive layer 306 acts as the cathode of the device. Second conductive layer 306 may be a metal, such as aluminum, and has a thickness between about 100 nm and about 150 nm, according to an embodiment. Similar to first conductive layer 304 described above, second conductive layer 306 may represent a stack of conductive layers. For example, second conductive layer 304 may include a layer of silver sandwiched between two layers of ITO (ITO/Ag/ITO). When a potential is applied across first conductive layer 304 and second conductive layer 306, an electric field is generated between the two conductive layers, and the transport of holes and electrons occurs.

The layer structure may also include a semiconductor polymer layer 308. Including semiconductor polymer layer 308 is optional, but the layer may be useful for hole injection. An example polymer for semiconductor polymer layer 308 is poly(3,4-ethylenedioxythiophene) polystyrene sulfonate (PEDOT:PSS). Semiconductor polymer layer 308 may have a thickness between about 20 nm and about 60 nm.

The layer structure may include transport layers to facilitate the transport of electrons and holes affected by the generated electric field between first conductive layer 304 and second conductive layer 306. A first transport layer 310 associated with first conductive layer 304 may be included, while a second transport layer 312 associated with second conductive layer 306 may be included. First transport layer 310 may act as a hole transport layer (and an electron and/or exciton blocking layer) when first conductive layer 304 acts as an anode (i.e., positively charged). First transport layer 310 may include copper oxide (Cu2O) and copper gallium oxide nanoparticles ($Cu_xGa_{1-x}O$). First transport layer 310 may also comprise an organic material such as N,N'-Di(1-naphthyl)-N,N'-diphenyl-(1,1'-biphenyl)-4,4'-diamine (NPB), Poly [(9,9-dioctylfluorenyl-2,7-diyl)-co-(4,4'-(N-(4-sec-butylphenyl) diphenylamine)] (TFB), or Poly(9-vinylcarbazole) (PVK) to name a few examples.

Second transport layer 312 may act as an electron transport layer (and a hole and/or exciton blocking layer) when second conductive layer 306 acts as a cathode (i.e., negatively charged). Second transport layer 312 may include zinc oxide (ZnO) or zinc magnesium oxide nanoparticles ($Zn_xMg_{1-x}O$). Second transport layer 312 may also comprise an organic material such as Tris(2,4,6-trimethyl-3-(pyridin-3-yl)phenyl)borane (3TPYMB) or 2,2',2"-(1,3,5-Benzinetriyl)-tris(1-phenyl-1-H-benzimidazole) (TPBi) to name a few examples.

The roles of first transport layer 310 and second transport layer 312 are reversed when the polarity of first conductive layer 304 and second conductive layer 306 are reversed. First transport layer 310 and second transport layer 312 may each have a thickness between about 20 nm and about 50 nm. Each of first transport layer 310 and second transport layer 312 may be substantially transparent to visible light.

Sandwiched between first transport layer 310 and second transport layer 312 is an active layer 314 that includes a plurality of QDs interspersed with a plurality of spacer particles, according to an embodiment. Active layer 314 may be formed by depositing the mixture of QDs 100 and spacer particles 202 followed by allowing the solvent to evaporate. In one example, the solvent evaporates at room temperature. In other example, heat is applied to the deposited film to hasten the evaporation of the solvent. The mixture of QDs 100 and spacer particles 202 may be deposited using a spin-coating technique as would be understood to a person skilled in the relevant art. Other manufacturing methods may be used. Active layer 314 may have a thickness between about 10 nm and about 50 nm.

When an electric field is applied between first conductive layer 304 and second conductive layer 306, the QDs within active layer 314 will emit light. The wavelengths of the emitted light will depend on the size and/or composition of the QD particles within active layer 314. Active layer 314 may include various-sized QDs to emit light across a range of wavelengths in the visible and/or infrared portion of the spectrum. The spacer particles present in active layer 314 are designed such that they do not emit light when the electric field is applied between first conductive layer 304 and second conductive layer 306, according to an embodiment. The spacer particles may also have a band gap large enough such that the spacer particles do not absorb the light emitted by the QDs.

It should be noted that although the embodiments disclosed herein relate to a QLED structure where an electric field is applied to cause the QDs to emit light, other applications with QDs may also benefit from the physical separation of the QDs using spacer particles. For example, a layer of QDs may be subjected to excitation light that is absorbed by the QDs and causes the QDs to emit light having a longer wavelength than the excitation light. Such QDs may also be physically separated using spacer particles, thus enhancing the brightness of the emitted light. In this example, a blue light source may be used to provide the excitation light to QDs that emit red and green light when absorbing the blue light.

Figure 4:
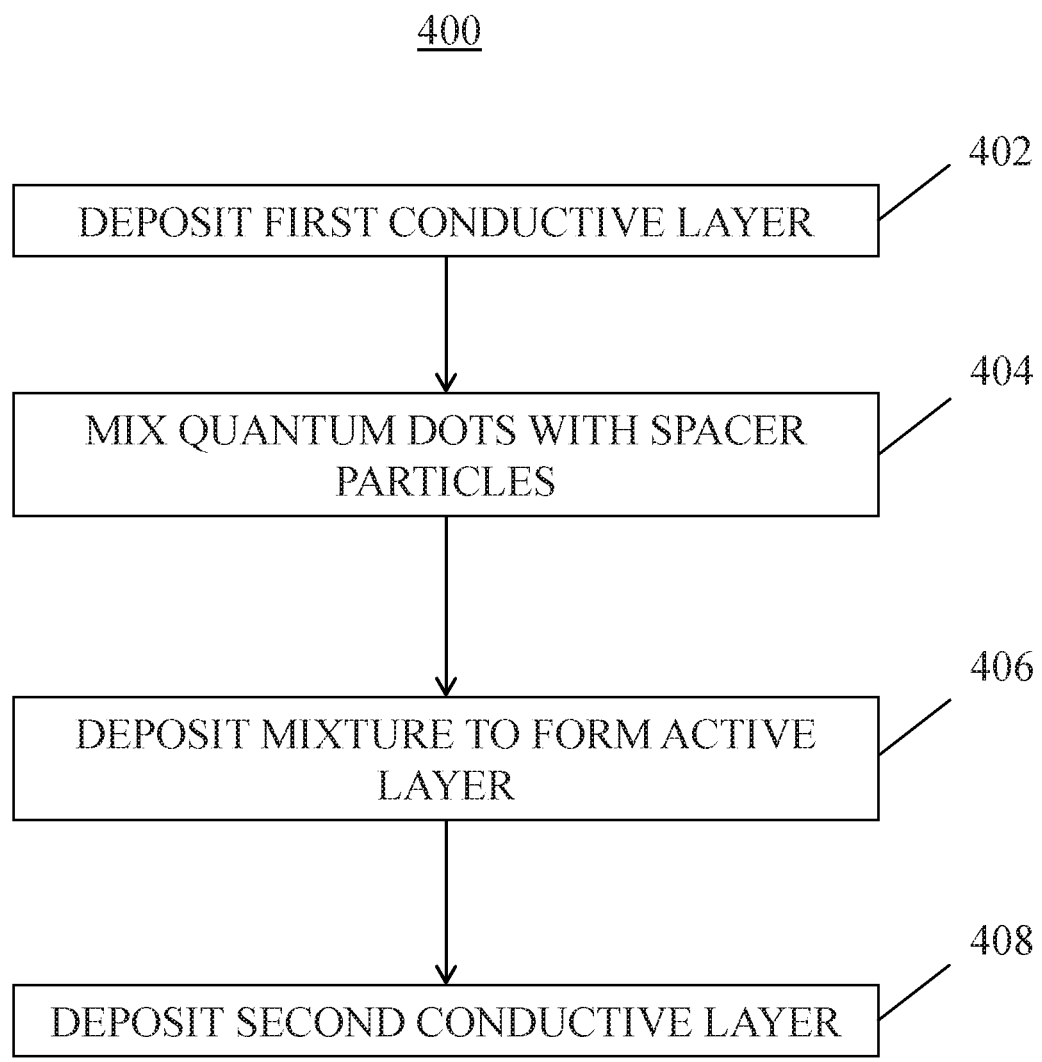
FIG. 4 illustrates a flowchart of an example method of making an illumination device.

FIG. 4 illustrates a flowchart of an example method 400 for making an illumination device, according to an embodiment. Some steps have been omitted to focus discussion on those that are more relevant. It should also be understood that the steps of method 400 may be performed in a different order without deviating from the scope or spirit of the invention.

Method 400 begins with block 402 where a first conductive layer is deposited. The first conductive layer may be deposited on a transparent substrate. In one embodiment, the first conductive layer is ITO.

Method 400 continues with block 404 where QDs are mixed with spacer particles, according to an embodiment. The QDs may be mixed with the spacer particles in a solvent. The concentration ratio by weight of QDs to spacer particles may be 1:2, 2:1, or 1:1, to name a few examples.

Method 400 continues with block 406 where the solvent mixture of QDs and spacer particles is deposited to form an active layer, according to an embodiment. The mixture is deposited above the first conductive layer, although it need not be deposited directly on the first conductive layer. The mixture may be deposited by spin-coating the solvent to a final thickness of around 30 nm. Following deposition, the solvent may be evaporated at room temperature to leave behind the QDs and spacer particles in the active layer.

Method 400 continues with block 408 where a second conductive layer is deposited above the active layer. The second conductive layer may be a metal, such as aluminum. The first and second conductive layers may act as the anode and cathode, respectively, of the illumination device.

Method 400 may include other steps related to the synthesis of the QDs and spacer particles. These synthesis steps may involve the formation of the core/shell structure of the QDs and binding ligands to the outer surface of the QDs and the spacer particles. Method 400 may also include steps for depositing a first transport layer on the first conductive layer, and depositing a second transport layer on the active layer. The first transport layer facilitates the transport of holes from the first conductive layer to the active layer and the second transport layer facilitates the transport of electrons from the second conductive layer to the active layer.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An illumination device, comprising:
a first conductive layer;
a second conductive layer; and
an active layer disposed between the first conductive layer and the second conductive layer,
wherein the active layer comprises quantum dots configured to emit light when an electric field is generated between the first and second conductive layers,
wherein the quantum dots are interspersed with spacer particles that are configured to not emit light when the electric field is generated between the first and second conductive layers,
wherein the spacer particles comprise a first group of spacer particles and a second group of spacer particles,
wherein the first group of the spacer particles has a first spacer particle size substantially equal to a size of the quantum dots and the second group of the spacer particles has a second spacer particle size smaller than the size of the quantum dots, and
wherein the first and second group of the spacer particles comprise a same material.

2. The illumination device of claim 1, wherein each of the quantum dots comprises a core structure and a shell structure surrounding the core structure.

3. The illumination device of claim 2, wherein the spacer particles comprise the same material as the shell structure.

4. The illumination device of claim 2, wherein each of the quantum dots comprises first ligands bound to the shell structure of each of the quantum dots.

5. The illumination device of claim 4, wherein the spacer particles comprise second ligands bound to the spacer particles.

6. The illumination device of claim 5, wherein the first ligands on the quantum dots have a same material as the second ligands on the spacer particles.

7. The illumination device of claim 1, wherein each of the quantum dots comprises a gradient material structure.

8. The illumination device of claim 1, wherein the quantum dots and the spacer particles have a 1:1 concentration ratio in the active layer.

9. The illumination device of claim 1, wherein the first conductive layer comprises indium tin oxide (ITO).

10. The illumination device of claim 1, wherein the second conductive layer comprises aluminum.

11. The illumination device of claim 1, further comprising:
   a first transport layer configured to facilitate transport of holes from the first conductive layer to the active layer; and
   a second transport layer configured to facilitate transport of electrons from the second conductive layer to the active layer.

12. A quantum dot light emitting diode (QLED), comprising:
   a first conductive layer on a substrate;
   an active layer disposed on the first conductive layer, wherein the active layer comprises quantum dots and non-luminescent spacer particles; and
   a second conductive layer disposed on the active layer, wherein the quantum dots are configured to emit light when an electric field is generated between the first and second conductive layers,
   wherein the non-luminescent spacer particles comprise a first group of non-luminescent spacer particles and a second group of non-luminescent spacer particles,
   wherein the first group of the non-luminescent spacer particles has a first particle size and the second group of the non-luminescent spacer particles has a second particle size different from the first particle size,
   wherein the first and second group of the non-luminescent spacer particles comprise a same material.

13. The QLED of claim 12, wherein the first particle size is smaller than a quantum dot size.

14. The QLED of claim 12, wherein the second particle size is substantially equal to a quantum dot size.

15. The QLED of claim 12, wherein the quantum dots and the non-luminescent spacer particles have a 1:1 concentration ratio in the active layer.

16. The QLED of claim 12, wherein the quantum dots and the non-luminescent spacer particles have a 2:1 concentration ratio in the active layer.

17. The QLED of claim 12, wherein the quantum dots and the non-luminescent spacer particles have a 1:2 concentration ratio in the active layer.

18. The QLED of claim 12, wherein each of the quantum dots comprises a core structure and a shell structure surrounding the core structure; and
   wherein each of the non-luminescent spacer particles comprises the same material as the shell structure.

19. The QLED of claim 12, wherein each of the non-luminescent spacer particles comprises a ligand bound to its outer surface.

20. The QLED of claim 12, wherein the first conductive layer comprises indium tin oxide (ITO) and the second conductive layer comprises aluminum.

21. The QLED of claim 12, further comprising:
   a first transport layer, on the first conductive layer, configured to facilitate transport of holes from the first conductive layer to the active layer; and
   a second transport layer, on the active layer, configured to facilitate transport of electrons from the second conductive layer to the active layer.

* * * * *